United States Patent [19]
Ryu

[11] Patent Number: 5,289,052
[45] Date of Patent: Feb. 22, 1994

[54] MONOSTABLE MULTIVIBRATOR

[75] Inventor: Jung-hyeong Ryu, Suwon, Rep. of Korea

[73] Assignee: Samsung Electronics Co., Ltd., Kyungki-do, Rep. of Korea

[21] Appl. No.: 982,893

[22] Filed: Nov. 30, 1992

[30] Foreign Application Priority Data

Nov. 30, 1991 [KR] Rep. of Korea ............... 91-21976

[51] Int. Cl.$^5$ .......................................... H03K 3/284
[52] U.S. Cl. .................................. 307/273; 307/265
[58] Field of Search ............. 307/273, 265, 350, 355, 307/356, 359, 246, 247.1

[56] References Cited

U.S. PATENT DOCUMENTS

| | | | |
|---|---|---|---|
| 3,582,687 | 6/1971 | Bellomo | 307/273 |
| 4,236,253 | 11/1980 | Onishi et al. | 307/273 |
| 4,521,694 | 6/1985 | Ryczek et al. | 307/273 |
| 4,572,966 | 2/1986 | Hepworth | 307/273 |
| 4,667,118 | 5/1987 | Maruta | 307/273 |
| 4,959,557 | 9/1990 | Miller | 307/265 |

FOREIGN PATENT DOCUMENTS 0243012  9/1990  Japan ...................... 307/273

Primary Examiner—William L. Sikes
Assistant Examiner—Toan Tran
Attorney, Agent, or Firm—Sughrue, Mion, Zinn, Macpeak & Seas

[57] ABSTRACT

A monostable multivibrator which includes a differential amplifier, a non-inverted reference potential supplying device, a charging/discharging circuit, and a switching transistor, and outputs a stabilized monostable oscillating signal in response to repeated trigger signal pulses. The monostable multivibrator can properly adjust the duty ratio by controlling the value of a resistance and capacitor, and has a constant duty ratio regardless of the fluctuation of the trigger pulse.

6 Claims, 1 Drawing Sheet

MONOSTABLE MULTIVIBRATOR

BACKGROUND OF THE INVENTION

The present invention is related to a monostable multivibrator, and more particularly to a monostable multivibrator using a differential amplifier.

A monostable multivibrator has a stable state and a metastable state. If induced with an external trigger signal, the monostable multivibrator maintains a metastable state for a predetermined time according to the time constant of the circuit, and then returns to the stable state. Furthermore, it is generally applied to a timer for timing operations measured in terms of seconds, and as low as microseconds.

Accordingly, in a monostable multivibrator, the duty ratio between metastable state and stable state should be maintained at a fixed rate, whenever the trigger pulse is applied. That is, a constant duty ratio and precise response are required regardless of the frequency or width of the trigger pulse, and if the frequency and/or width fluctuate, a constant duty ratio cannot be maintained.

SUMMARY OF THE INVENTION

The object of the present invention is to provide a monostable multivibrator which is stably operated regardless of the fluctuation of a trigger pulse to solve the above problem.

To achieve the above object, there is provided a monostable multivibrator comprising:

a differential amplifier having a non-inverting input terminal connected to a first node and an inverting input terminal connected to a second node, and responding to the potential difference between the first and second nodes to supply an output signal to an output terminal;

a non-inverted reference potential supplying means for providing a first reference potential to the first node when the output signal is in a "high" state, and providing a second reference potential lower than the first reference signal when the output signal is in a "low" state;

a charging/discharging circuit for charging toward a third reference potential lower than the first reference potential and higher than the second reference potential when the output signal is in a "high" state, and discharging toward a fourth reference potential lower than the second reference potential when the output signal is in a "low" state, to thereby provide the charged and discharged potentials to the second node; and a switching transistor connected between the first node and ground potential and responding to an external trigger signal to be switched, thereby resulting in the multivibrator outputting a stabilized monostable oscillating signal with the input of repeated trigger signal pulses.

BRIEF DESCRIPTION OF THE DRAWINGS

Further features and advantages will become more apparent from the following and more particular description of the preferred embodiment of the invention as illustrated in the accompanying drawings in which the same reference characters generally refer to like parts throughout the views, and in which.

DETAILED DESCRIPTION OF THE INVENTION

Figure 1:
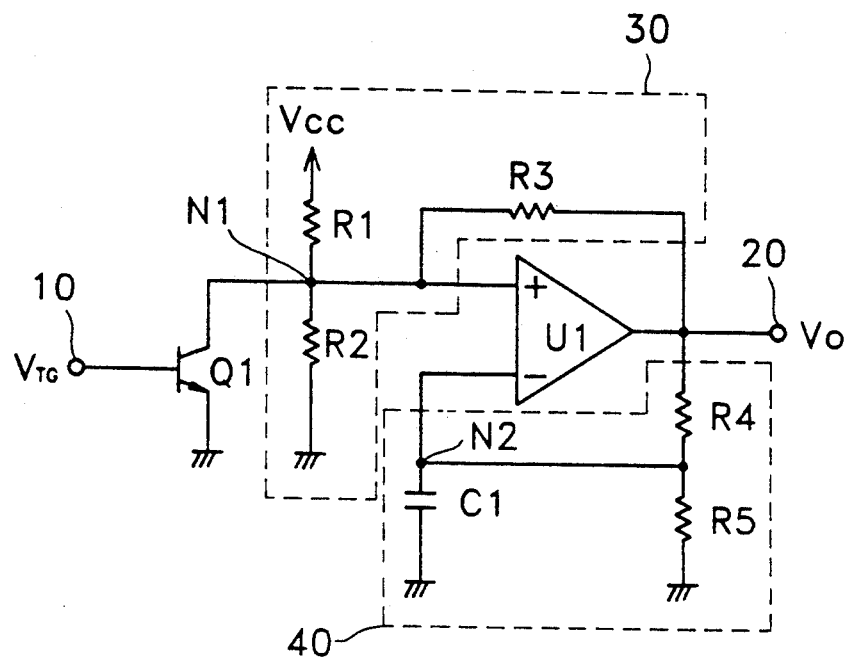
FIG. 1 is a circuit diagram of monostable multivibrator according to the present invention.

In FIG. 1, reference numeral 10 denotes an input terminal, and 20 denotes an output terminal. A differential amplifier U1 has a non-inverting input terminal (+) connected to a first node N1 and an inverting input terminal (−) connected to a second node N2. The output signal of differential amplifier is fed to output terminal 20.

A non-inverted reference potential supplying unit 30 includes resisters R1 and R2 serially coupled between a supply voltage Vcc and a ground potential, and a resister R3 coupled between output terminal 20 and first node N1 which is commonly connected to resisters R1 and R2. Accordingly, when output terminal 20 is in "high" state, non-inverted reference potential supplying unit 30 provides to first node N1 a first reference potential $V_{+H}$ expressed by the following equation (1).

$$V_{+H} = \frac{R2}{(R1 \| R3) + R2} \times V_{cc} \quad (1)$$

Meanwhile, when output terminal 20 is in a "low" state, a second reference potential $V_{+L}$ expressed by the following equation (2) is provided to first node N1.

$$V_{+L} = \frac{R2 \| R3}{R1 + (R2 \| R3)} \times V_{cc} \quad (2)$$

(The above equations (1) and (2) show that a high output signal $V_{OH}$ is equal to the supply voltage Vcc and a low output signal $V_{OL}$ is equal to the ground potential.)

A charging/discharging circuit 40 comprises resistors R4 and R5 serially connected between output terminal 20 and the ground potential, and a capacitor C1 connected between ground potential and second node N2 which is commonly connected to resistors R4 and R5.

In charging/discharging circuit 40, when output terminal 20 is in a "high" state, capacitor C1 is charged according to the following equation (3).

$$Vc = (V_{-H} - V_{+L}) \times (1 - e^{-t/\tau}) + V_{+L} \quad (3)$$

Meanwhile, when output terminal 20 is in a "low" state, capacitor C1 is discharged according to the following equation (4).

$$Vd = (V_{-L} - V_{+L} - V_T) \times (1 - e^{-t/\tau}) + V_T \quad (4)$$

The voltage $V_{-H}$ is a third reference potential and expressed by the following equation (5).

$$V_{-H} = \frac{R5}{R4 + R5} \times V_{OH} \quad (5)$$

The voltage $V_T$ denotes the increased charging voltage of capacitor C1 when the next trigger pulse $V_{TG}$ is supplied to the $V_{+L}$ potential, and is expressed by the following equation (6).

$$V_T = (V_{+H} - V_{+L}) \times \frac{1}{\tau} \times Tc \quad (6)$$

A switching transistor Q1 is a bipolar transistor having its base connected to receive an external trigger pulse $V_{TG}$, its collector connected to first node N1, and its emitter grounded. Accordingly, when transistor Q1 is turned on, first node N1 temporarily falls to ground potential.

Figure 2:
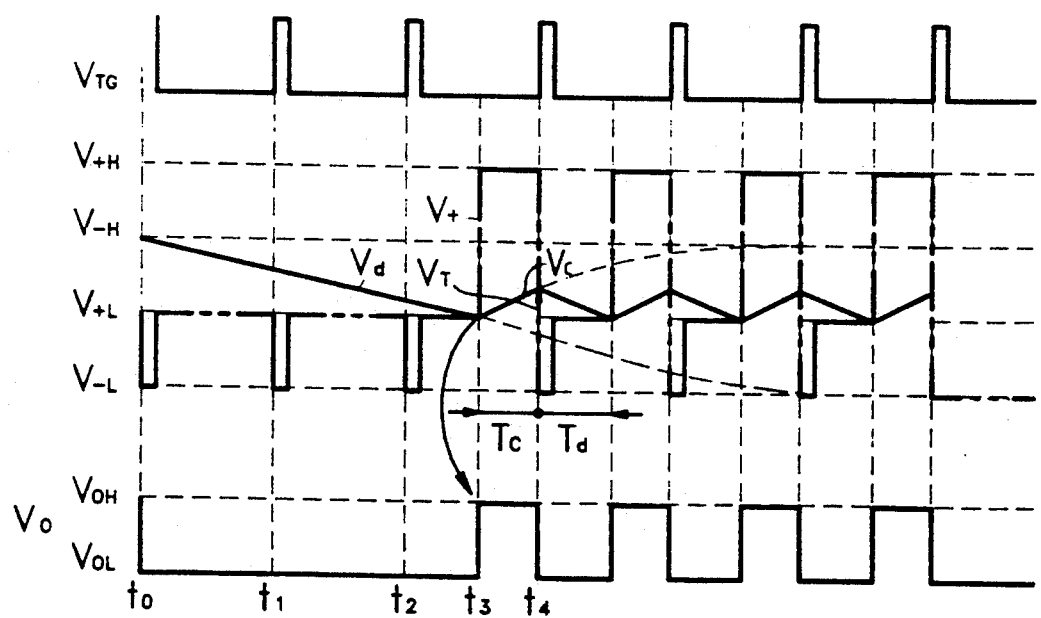
FIG. 2 is a timing chart showing the relationship between respective parts of FIG. 1.

The operational effect of the present invention constructed as above will be explained with reference to FIG. 2.

When supply voltage Vcc is supplied to the circuit of the present invention, capacitor C1 is charged up to a third reference potential $V_{-H}$.

Since first node N1 temporarily falls to ground potential via transistor Q1, when trigger pulse $V_{TG}$ is input at time t0, the transition of output terminal 20 from $V_{OH}$ to $V_{OL}$ is accomplished by differential amplifier U1. Then, even though trigger pulse $V_{TG}$ is input at time t1 and t2, output signal Vo does not change, staying low ($V_{OL}$) until discharging potential Vd of capacitor C1 drops lower than second reference potential $V_{+L}$. If Vd is less than $V_{+L}$ at time t3, output signal Vo transits to a "high" state ($V_{OH}$), so that first node N1 becomes first reference potential $V_{+H}$, and thus capacitor C1 is recharged via resistor R4 and stabilized.

If trigger pulse $V_{TG}$ is input at time t4, the potential of first node N1 falls to ground potential, so that output terminal 20 transits to a "low" state ($V_{OL}$) and the charging of capacitor C1 stops, to initiate the discharge cycle. Here, first node N1 is at second reference potential $V_{+L}$ while second node N2 is at discharging potential Vd (higher than $V_{+L}$), so that output signal Vo is at metastable "low" state ($V_{OL}$). At time t5, if discharging potential Vd of second node N2 drops below $V_{+L}$, output signal Vo transits from $V_{OL}$ to $V_{OH}$, and the potential of first node N1 becomes equal to first reference potential $V_{+H}$. Accordingly, capacitor C1 is recharged until a next trigger pulse is supplied. As mentioned above, whenever trigger pulse $V_{TG}$ is supplied, output signal Vo having metastable and stable states is obtained by repeated charging and discharging operations.

The duty ratio of output signal Vo is expressed by the following equation (7).

$$\frac{Td}{Tc + Td} = \frac{(V_{-H} - V_{+L}) \times (V_{+L} + V_{+T})}{1 + (V_{-H} - V_{+L})/(V_{+L} + V_T)} = \frac{V_{+H} + V_{+L}}{V_{-H} + V_T} \quad (7)$$

Here, Td denotes the discharge period and Tc denotes the charge period. If $V_{-H}$ is much greater than $V_T$, then equation (7) may be simplified to equation (8).

$$\frac{Td}{Tc + Td} = \frac{V_{-H} - V_{+L}}{V_{-H}} \quad (8)$$

In the monostable multivibrator, the duty ratio is determined by the reference potential ($V_{-H}$ or $V_{+L}$) set by the resistance value regardless of the frequency and width of the trigger pulse, thus obtaining a stable duty ratio.

Accordingly, as Td increases, Tc is shortened and $V_T$ of the next period is lowered, so that Td (discharged period) is shortened. Therefore, as the trigger pulse is supplied repeatedly, the duty ratio stabilizes to the predetermined value. Accordingly, the present invention provides a monostable multivibrator which can properly adjust the duty ratio by controlling the value of the resistance and capacitor, and has a constant duty ratio regardless of trigger pulse fluctuation.

Having described a preferred embodiment of the present invention, it will be clear to those skilled in the art that modifications and alternatives to the disclosed apparatus exist within the scope and spirit of the present invention. Accordingly, it is intended to limit the scope of the present invention only as indicated in the following claims.

What is claimed is:
1. A monostable multivibrator comprising:
   a differential amplifier having a non-inverting input terminal connected to a first node and an inverting input terminal connected to a second node, and responding to a potential difference between said first and second nodes to supply an output signal to an output terminal;
   a non-inverted reference potential supplying means for providing a first reference potential to said first node when said output signal is in a first state, and providing a second reference potential to said first node, said second reference potential being lower than said first reference signal when said output signal is in a second state which is different from the first state;
   a charging/discharging circuit for charging toward a third reference potential which is lower than said first reference potential and which is higher than said second reference potential when said output signal is in the first state, and discharging toward a fourth reference potential which is lower than said second reference potential when said output signal is in the second state, to thereby provide the charged and discharged potentials to said second node; and
   a switching transistor connected between said first node and ground potential and switching in response to an external trigger signal, so that said multivibrator outputs a stabilized monostable oscillating signal in response to repeated trigger signal pulses.

2. A monostable multivibrator as claimed in claim 1, wherein said non-inverted reference potential supplying means comprises first and second resistors serially connected between a supply voltage and ground, and a third resistor connected between said output terminal and said first node, each of said first and second resistors being connected to said first node.

3. A monostable multivibrator as claimed in claim 2, wherein said charging/discharging circuit comprises fourth and fifth resistors serially connected between said output terminal and ground, and a capacitor coupled between ground and said second node, each of said fourth and fifth resistors being connected to said second node.

4. A monostable multivibrator as claimed in claim 1, wherein said first state is a HIGH state, and said second state is a LOW state.

5. A monostable multivibrator as claimed in claim 1, wherein said charging/discharging circuit comprises first and second resistors serially connected between said output terminal and ground, and a capacitor coupled between ground and said second node, each of said first and second resistors being connected to said second node.

6. A monostable multivibrator as claimed in claim 1, wherein said switching transistor is a bipolar transistor having its collector connected to the first node, its emitter connected to ground, and its base connected to receive the external trigger signal.

* * * * *